US012751278B2

(12) United States Patent
Ashidate et al.

(10) Patent No.: US 12,751,278 B2
(45) Date of Patent: Sep. 29, 2026

(54) SEMICONDUCTOR STORAGE DEVICE AND MANUFACTURING METHOD THEREOF

(71) Applicant: Kioxia Corporation, Tokyo (JP)

(72) Inventors: Hiroaki Ashidate, Mie (JP); Tomoyuki Takeishi, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 686 days.

(21) Appl. No.: 18/178,008

(22) Filed: Mar. 3, 2023

(65) Prior Publication Data

US 2023/0395498 A1 Dec. 7, 2023

(30) Foreign Application Priority Data

Jun. 1, 2022 (JP) ................................ 2022-089759

(51) Int. Cl.

| | |
|---|---|
| ***H10B 43/10*** | (2023.01) |
| ***G11C 16/04*** | (2006.01) |
| ***H10B 43/27*** | (2023.01) |
| ***H10B 43/35*** | (2023.01) |
| ***H10B 43/40*** | (2023.01) |

(Continued)

(52) U.S. Cl.

CPC ....... *H10W 20/435* (2026.01); *G11C 16/0483* (2013.01); *H10B 43/10* (2023.02); *H10B 43/27* (2023.02); *H10B 43/35* (2023.02); *H10B 43/40* (2023.02); *H10D 88/00* (2025.01); *H10D 88/101* (2025.01)

(58) Field of Classification Search

CPC ...... H10B 80/00; H10D 88/00; H10K 19/201; H10K 71/50; H01L 25/16; H01L 25/074; H01L 25/043; H01L 25/0657; H01L 25/0756; H01L 25/117

See application file for complete search history.

(56) References Cited

U.S. PATENT DOCUMENTS

| | | | | |
|---|---|---|---|---|
| 8,546,188 | B2 * | 10/2013 | Liu | H01L 25/0657 438/455 |
| 9,741,603 | B2 | 8/2017 | Tobisaka et al. | |
| 10,074,667 | B1 | 9/2018 | Higashi et al. | |

(Continued)

FOREIGN PATENT DOCUMENTS

| | | |
|---|---|---|
| EP | 0 478 426 A1 | 4/1992 |
| JP | 4-262566 A | 9/1992 |

(Continued)

*Primary Examiner* — David A Zarneke

(74) *Attorney, Agent, or Firm* — Oblon, McClelland, Maier & Neustadt, L.L.P.

(57) ABSTRACT

A semiconductor storage device includes a first layer including a first surface and a second surface located opposite to the first surface. The first layer includes a first memory cell array and a first wire layer, the first memory cell array being provided between the first surface and the second surface and including a plurality of first memory cells, and the first wire layer facing the first surface and being electrically connected to the first memory cells. A second layer includes a third surface and a fourth surface located opposite to the third surface. The second layer includes a second memory cell array provided between the third surface and the fourth surface to be electrically connected to the first wire layer and including a plurality of second memory cells. The first layer and the second layer are joined together on the first surface and the third surface.

5 Claims, 11 Drawing Sheets

(51) Int. Cl.
*H10D 88/00* (2026.01)
*H10W 20/41* (2026.01)

(56) References Cited

U.S. PATENT DOCUMENTS

| | | | | |
|---|---|---|---|---|
| 10,476,231 | B2 | 11/2019 | Menezo et al. | |
| 11,217,560 | B2 * | 1/2022 | Shih | H01L 24/08 |
| 11,557,572 | B2 * | 1/2023 | Huang | H01L 24/80 |
| 11,562,982 | B2 * | 1/2023 | Hu | H01L 24/80 |
| 11,672,111 | B2 * | 6/2023 | Chen | H01L 23/5226 257/621 |
| 12,501,630 | B2 * | 12/2025 | Or-Bach | H01L 25/18 |
| 2007/0267723 | A1 * | 11/2007 | Bernstein | H10W 90/00 438/455 |
| 2009/0065941 | A1 * | 3/2009 | La Tulipe, Jr. | H10W 20/081 257/761 |
| 2011/0143506 | A1 * | 6/2011 | Lee | H10B 12/05 438/238 |
| 2012/0248580 | A1 * | 10/2012 | Matsugai | H10F 39/809 257/621 |
| 2015/0021784 | A1 * | 1/2015 | Lin | H10W 20/20 438/459 |
| 2018/0025970 | A1 * | 1/2018 | Kao | H10W 20/056 257/401 |
| 2018/0277497 | A1 * | 9/2018 | Matsuo | H10W 42/00 |
| 2020/0203329 | A1 * | 6/2020 | Kanamori | H10D 88/00 |
| 2020/0365593 | A1 * | 11/2020 | Chen | H01L 24/17 |
| 2021/0134748 | A1 * | 5/2021 | Liu | H01L 25/18 |
| 2022/0077129 | A1 | 3/2022 | Sung et al. | |

FOREIGN PATENT DOCUMENTS

| | | | | |
|---|---|---|---|---|
| JP | 6168143 | B2 | 7/2017 | |
| JP | 2018-148071 | A | 9/2018 | |
| JP | 2018-152419 | A | 9/2018 | |
| JP | 2019-161229 | A | 9/2019 | |
| JP | 2020-47814 | A | 3/2020 | |
| KR | 20100094905 | A * | 8/2010 | H10W 80/00 |

* cited by examiner

SEMICONDUCTOR STORAGE DEVICE AND MANUFACTURING METHOD THEREOF

CROSS REFERENCE TO RELATED APPLICATIONS

This application is based upon and claims the benefit of priority from the prior Japanese Patent Application No. 2022-089759, filed on Jun. 1, 2022, the entire contents of which are incorporated herein by reference.

FIELD

The embodiments of the present invention relate to a semiconductor storage device and a manufacturing method thereof.

BACKGROUND

In recent years, a technique is being developed to bond a plurality of semiconductor wafers to each other to electrically join pads or wires to each other. However, with the downscaling of the pads or wires, it is more difficult to precisely align the positions of the pads or wires with each other.

DETAILED DESCRIPTION

Figure 1:
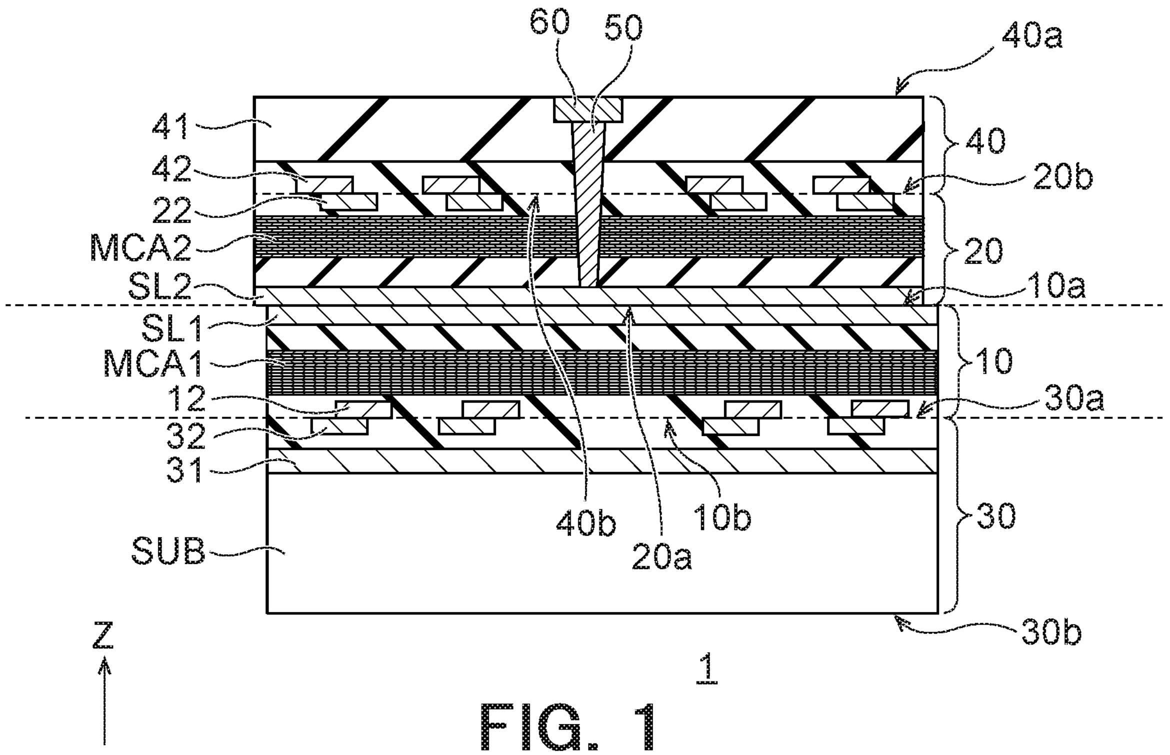
FIG. 1 is a cross-sectional view illustrating a configuration example of a semiconductor storage device according to a first embodiment.

Embodiments will now be explained with reference to the accompanying drawings. The present invention is not limited to the embodiments. In the embodiments, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor storage device according to embodiments of the present invention comprises a first layer including a first surface and a second surface located opposite to the first surface. The first layer includes a first memory cell array and a first wire layer, the first memory cell array being provided between the first surface and the second surface and including a plurality of first memory cells, and the first wire layer facing the first surface and being electrically connected to the first memory cells. A second layer includes a third surface and a fourth surface located opposite to the third surface. The second layer includes a second memory cell array provided between the third surface and the fourth surface to be electrically connected to the first wire layer, and including a plurality of second memory cells. The first layer and the second layer are joined together on the first surface and the third surface.

First Embodiment

FIG. 1 is a cross-sectional view illustrating a configuration example of a semiconductor storage device according to a first embodiment. A semiconductor storage device 1 according to the present embodiment includes memory cell array layers 10 and 20, a control circuit layer 30, and a multilayered wire layer 40. The semiconductor storage device 1 is a semiconductor chip formed by bonding (layering) a plurality of substrates (wafers) to each other, respectively including the memory cell array layers 10 and 20, the control circuit layer 30, and the multilayered wire layer 40, and then by dicing the bonded substrates into pieces.

The memory cell array layer 10 includes a first surface 10*a* and a second surface 10*b* located opposite to the first surface 10*a*. The memory cell array layer 10 includes a memory cell array MCA1, a source layer SL1, and pads 12. The memory cell array MCA1 includes a plurality of memory cells arranged in three dimensions. The memory cell array MCA1 is provided between the first surface 10*a* and the second surface 10*b*. The configuration of the memory cell array MCA1 is described later in more detail. The source layer SL1 faces the first surface 10*a* and is electrically connected to the memory cells in the memory cell array MCA1 through a multilayered wire layer and other layers. The source layer SL1 is connected to a CMOS (Complementary Metal Oxide Semiconductor) circuit 31 in the control circuit layer 30 through a multilayered wire layer and other layers. With this configuration, the source layer SL1 is set at a predetermined source voltage, so that a source voltage can be applied to each of the memory cells of the memory cell array MCA1. The pads 12 face the second surface 10*b* and are electrically connected to the memory cells in the memory cell array MCA1 through a multilayered wire layer and other layers.

The first surface 10*a* of the memory cell array layer 10 and a third surface 20*a* of the memory cell array layer 20 are bonded to each other, forming a bonding surface. The source layer SL1 is joined to a source layer SL2 of the memory cell array layer 20 on the bonding surface between the first surface 10*a* and the third surface 20*a*. With this configuration, the source layers SL1 and SL2 function as a single common source layer SL1 and SL2.

The memory cell array layer 20 includes the third surface 20*a* and a fourth surface 20*b* located opposite to the third surface 20*a*. The memory cell array layer 20 includes a memory cell array MCA2, the source layer SL2, and pads 22. The memory cell array MCA2 includes a plurality of memory cells arranged in three dimensions. The memory cell array MCA2 is provided between the third surface 20*a* and the fourth surface 20*b*. The configuration of the memory cell array MCA2 is described later in more detail. The source layer SL2 faces the third surface 20*a* and is electrically connected to the memory cells in the memory cell array MCA2 through a multilayered wire layer and other layers. As described above, the source layer SL2 is joined to the source layer SL1 of the memory cell array layer 10 on the third surface 20*a*. With this configuration, the source layer SL2 along with the source layer SL1 are set at a predetermined source voltage, so that the source voltage can be applied to each of the memory cells of the memory cell array MCA2. The pads 22 face the fourth surface 20*b* and are electrically connected to the memory cells in the memory cell array MCA2 through a multilayered wire layer and other layers.

The control circuit layer 30 includes a fifth surface 30*a* and a sixth surface 30*b* located opposite to the fifth surface 30*a*. The control circuit layer 30 includes a substrate SUB, the CMOS circuit 31, and pads 32. For example, the substrate SUB is a silicon substrate. The CMOS circuit 31 is made up of semiconductor elements such as a transistor, a resistance element, and a capacitive element. The CMOS circuit 31 is provided on the substrate SUB. The CMOS circuit 31 is provided between the fifth surface 30*a* and the sixth surface 30*b*. The pads 32 face the fifth surface 30*a* and are electrically connected to the CMOS circuit 31 through a multilayered wire layer (denoted by reference numeral 34 in FIG. 16).

The second surface 10*b* of the memory cell array layer 10 and the fifth surface 30*a* of the control circuit layer 30 are bonded to each other, forming a bonding surface. The pads 12 in the memory cell array layer 10 and the pads 32 in the control circuit layer 30 are joined to each other on the bonding surface between the second surface 10*b* and the fifth surface 30*a*. With this configuration, the CMOS circuit 31 is electrically connected to the memory cell array MCA1, and thus can supply power to the memory cell array MCA1, transmit a command to the memory cell array MCA1, and receive a signal from the memory cell array MCA1. The CMOS circuit 31 is also electrically connected to the memory cell array layer 20 through the memory cell array layer 10 and the multilayered wire layer 40, and thus can supply power to the memory cell array MCA2, transmit a command to the memory cell array MCA2, and receive a signal from the memory cell array MCA2.

The multilayered wire layer 40 includes a seventh surface 40*a* and an eighth surface 40*b* located opposite to the seventh surface 40*a*. The multilayered wire layer 40 includes an interlayer dielectric film 41 and pads 42. The pads 42 are electrically connected to the interlayer dielectric film 41 and are connected optionally to any of the memory cell array layers 10 and 20 and the control circuit layer 30. The pads 42 face the eighth surface 40*b* and are electrically connected to a wire (denoted by reference numeral 44 in FIG. 16) in the interlayer dielectric film 41.

The fourth surface 20*b* of the memory cell array layer 20 and the eighth surface 40*b* of the multilayered wire layer 40 are bonded to each other, forming a bonding surface. The pads 42 in the multilayered wire layer 40 and the pads 22 in the memory cell array layer 20 are joined to each other on the bonding surface between the eighth surface 40*b* and the fourth surface 20*b*. With this configuration, the wire in the interlayer dielectric film 41 can electrically connect any of the CMOS circuit 31, the memory cell array MCA1, and the memory cell array MCA2 optionally.

A contact plug 50 penetrates the multilayered wire layer 40 and the memory cell array layer 20 and is connected to the source layer SL2. A pad 60 is provided on the seventh surface 40*a* of the multilayered wire layer 40 and is electrically connected to the contact plug 50. The pad 60 is used to apply the source voltage to the source layers SL1 and SL2.

According to the present embodiment, on the first surface 10*a* of the memory cell array layer 10 and the third surface 20*a* of the memory cell array layer 20, the source layer SL1 and the source layer SL2 are directly joined (bonded) together. With this configuration, the source layers SL1 and SL2 function as an integrated common source layer. The source layer SL1 is common to each memory cell of the memory cell array MCA1. The source layer SL2 is common to each memory cell of the memory cell array MCA2. Therefore, the source layers SL1 and SL2 are widely provided appropriate to the planar layout of the memory cell arrays MCA1 and MCA2. Consequently, the source layer SL1 and the source layer SL2 are easily joined together. As illustrated in FIG. 1, even when the bonding position of the first surface 10*a* is slightly misaligned with that of the third surface 20*a*, an adequate electrical connection can still be ensured.

FIGS. 2A to 10 are cross-sectional views illustrating an example of a manufacturing method of the semiconductor storage device 1 according to the first embodiment.

Figure 2A:
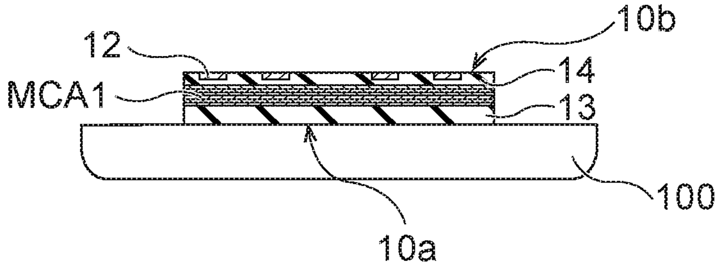
FIG. 2A is a cross-sectional view illustrating an example of a manufacturing method of the semiconductor storage device according to the first embodiment.

First, as illustrated in FIG. 2A, an interlayer dielectric film and a multilayered wire layer 13 are formed on a support substrate 100. An insulating material such as a silicon oxide film is used for the interlayer dielectric film. Conductive material such as copper or tungsten is used for the multilayered wire layer 13. Next, the memory cell array MCA1 is formed on the interlayer dielectric film. Subsequently, an interlayer dielectric film and a multilayered wire layer 14 are formed on the memory cell array MCA1. The multilayered wire layer 14 is electrically connected to the memory cell array MCA1. The pads 12 are formed on the multilayered wire layer 14. The pads 12 are electrically connected to the multilayered wire layer 14, and thus are electrically connected to the memory cell array MCA1 through the multilayered wire layer 14. The pads 12 are exposed from the second surface 10*b*. Next, a dicing blade or other tool is used to cut and trim the interlayer dielectric film and other layers located on each end of the support substrate 100. In this manner, the structure illustrated in FIG. 2A is obtained.

Figure 2B:
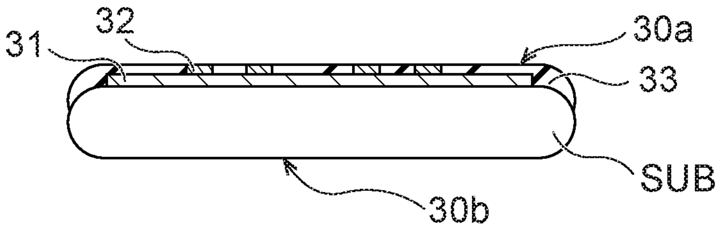
FIG. 2B is a cross-sectional view illustrating an example of the manufacturing method of the semiconductor storage device according to the first embodiment.

Separately from, or in parallel with, the step illustrated in FIG. 2A, the CMOS circuit 31 is formed on the substrate SUB as illustrated in FIG. 2B. Subsequently, an interlayer dielectric film and a multilayered wire layer 33 are formed on the CMOS circuit 31. Next, the pads 32 are formed on the multilayered wire layer 33. The pads 32 are electrically connected to the multilayered wire layer 33, and thus are electrically connected to the CMOS circuit 31 through the multilayered wire layer 33. The pads 32 are exposed from the fifth surface 30*a*. In this manner, the structure illustrated in FIG. 2B is obtained.

Figure 3:
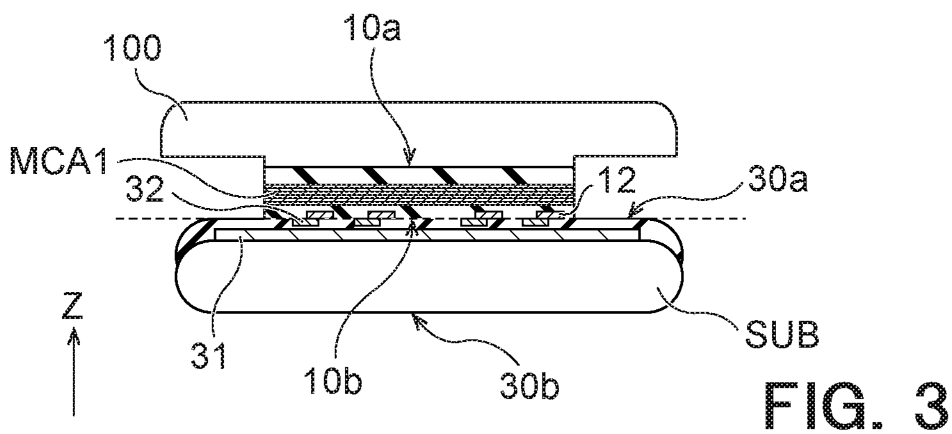
FIG. 3 is a cross-sectional view illustrating the manufacturing method of the semiconductor storage device, following FIGS. 2A and 2B.

Subsequently, as illustrated in FIG. 3, the second surface 10*b* is bonded to the fifth surface 30*a* with the support substrate 100 being opposite to the substrate SUB. At this time, the pads 12 are aligned with the pads 32 to be joined together to bond them together. With this step, the pads 12 and the pads 32 are electrically connected, and thus the CMOS circuit 31 and the memory cell array MCA1 are electrically connected.

Figure 4:
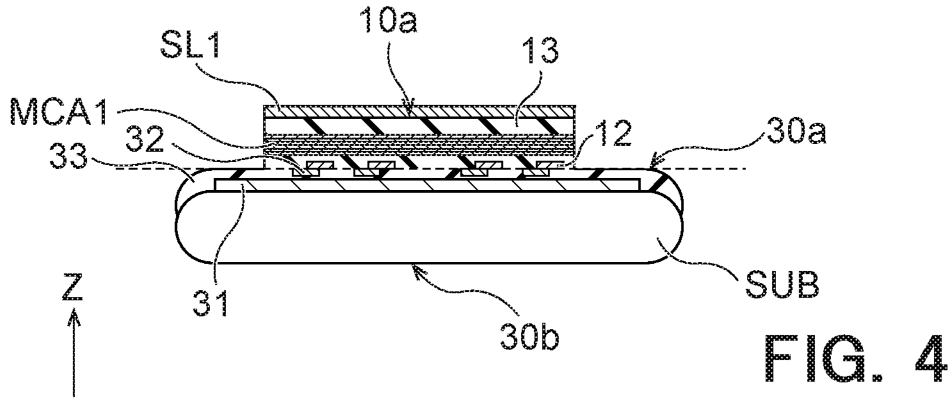
FIG. 4 is a cross-sectional view illustrating the manufacturing method of the semiconductor storage device, following FIG. 3.

Next, as illustrated in FIG. 4, the support substrate 100 is separated from the multilayered wire layer 13 or is polished to expose the multilayered wire layer 13. Subsequently, the source layer SL1 is formed on the multilayered wire layer 13. With this step, the source layer SL1 is electrically connected to the memory cell array MCA1, so that a source voltage can be applied to the memory cell array MCA1. The source layer SL1 is common to a plurality of memory cells of the memory cell array MCA1, and has an area substantially equal to or larger than the layout area of the memory cell array MCA1 when viewed in plan from the Z direction. In the manner as described above, the memory cell array MCA1 including the memory cells is formed above the substrate SUB. Further, the source layer SL1 is formed above the memory cell array MCA1, and is electrically connected to the memory cells.

Figure 5A:
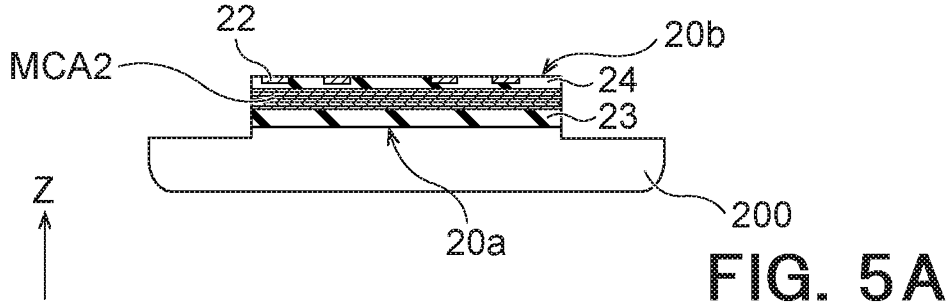
FIG. 5A is a cross-sectional view illustrating an example of the manufacturing method of the semiconductor storage device according to the first embodiment.

Separately from, or in parallel with, the steps illustrated in FIGS. 2A to 4, an interlayer dielectric film and a multilayered wire layer 23 are formed on a support substrate 200 as illustrated in FIG. 5A. For example, a silicon oxide film is used as the interlayer dielectric film. A conductive material such as copper or tungsten is used for the multilayered wire layer 23. Next, the memory cell array MCA2 is formed on the multilayered wire layer 23. Subsequently, an interlayer dielectric film and a multilayered wire layer 24 are formed on the memory cell array MCA2. The multilayered wire layer 24 is electrically connected to the memory cell array MCA2. The pads 22 are formed on the multilayered wire layer 24. The pads 22 are electrically connected to the multilayered wire layer 24, and thus are electrically connected to the memory cell array MCA2 through the multilayered wire layer 24. The pads 22 are exposed from the fourth surface 20*b*. Next, a dicing blade or other tool is used to cut and trim the interlayer dielectric film and other layers located on each end of the support substrate 200. In this manner, the structure illustrated in FIG. 5A is obtained.

Figure 5B:
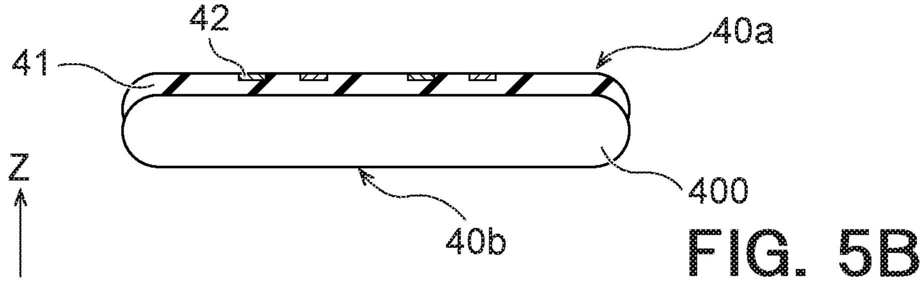
FIG. 5B is a cross-sectional view illustrating an example of the manufacturing method of the semiconductor storage device according to the first embodiment.

Separately from, or in parallel with, the steps illustrated in FIGS. 2A to 5A, an interlayer dielectric film and the multilayered wire layer 40 are formed on a support substrate 400 as illustrated in FIG. 5B. Next, the pads 42 are formed on the multilayered wire layer 40. The pads 42 are electrically connected to the multilayered wire layer 40. The pads 42 are exposed from the seventh surface 40*a*. In this manner, the structure illustrated in FIG. 5B is obtained.

Figure 6:
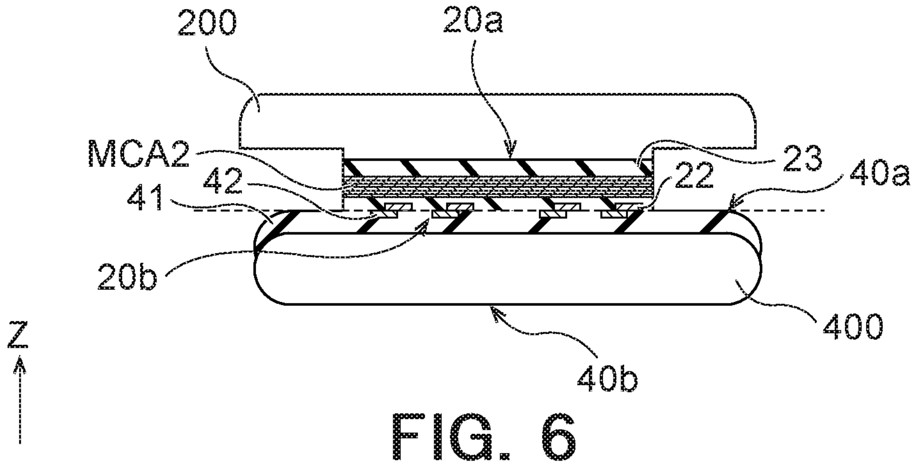
FIG. 6 is a cross-sectional view illustrating the manufacturing method of the semiconductor storage device, following FIGS. 5A and 5B.

Subsequently, as illustrated in FIG. 6, the fourth surface 20*b* is bonded to the seventh surface 40*a* with the support substrate 200 being opposite to the support substrate 400. At this time, the pads 22 are aligned with the pads 42 to be joined together to bond them together. With this step, the pads 22 and the pads 42 are electrically connected, and thus the memory cell array MCA2 and the multilayered wire layer 40 are electrically connected.

Figure 7:
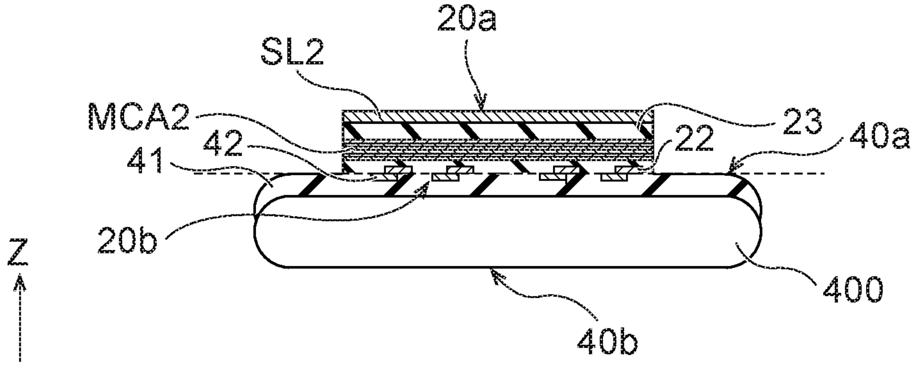
FIG. 7 is a cross-sectional view illustrating the manufacturing method of the semiconductor storage device, following FIG. 6.

Next, as illustrated in FIG. 7, the support substrate 200 is separated from the multilayered wire layer 23 or is polished to expose the multilayered wire layer 23. Subsequently, the source layer SL2 is formed on the multilayered wire layer 23. With this step, the source layer SL2 is electrically connected to the memory cell array MCA2, so that a source voltage can be applied to the memory cell array MCA2. The source layer SL2 is common to a plurality of memory cells of the memory cell array MCA2, and has an area substantially equal to or larger than the layout area of the memory cell array MCA2 when viewed in plan from the Z direction. In this manner, the memory cell array MCA2 including the memory cells is formed above the support substrate 400. The source layer SL2 is formed above the memory cell array MCA2, and is electrically connected to the memory cells.

Figure 8:
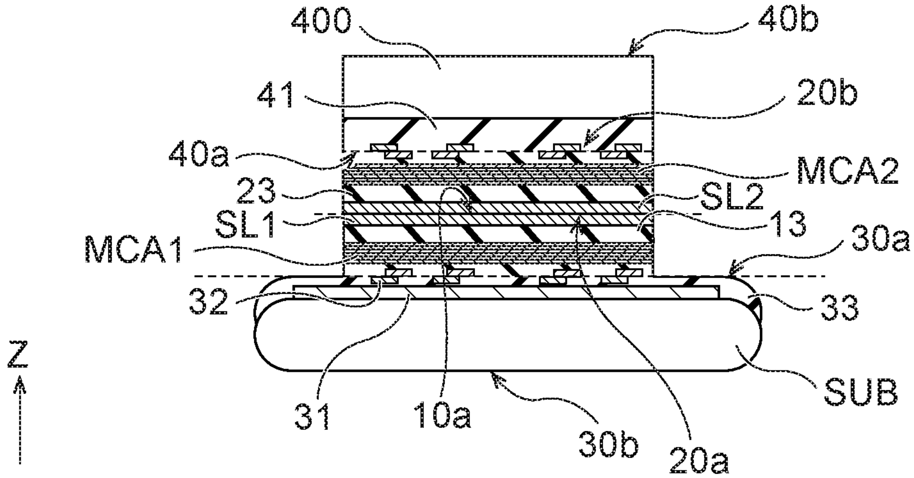
FIG. 8 is a cross-sectional view illustrating the manufacturing method of the semiconductor storage device, following FIG. 7.

Next, a dicing blade or other tool is used to cut and trim each end portion of the support substrate 400. Subsequently, as illustrated in FIG. 8, the substrate SUB in FIG. 4 and the support substrate 400 in FIG. 7 are bonded together with the substrate SUB and the support substrate 400 being opposite to each other. At this time, the source layer SL1 exposed on the first surface 10*a* and the source layer SL2 exposed on the third surface 20*a* are joined together. Since both the source layers SL1 and SL2 have an area substantially equal to or larger than that of the memory cell arrays MCA1 and MCA2, an adequate electrical connection can still be ensured even when misalignment has occurred to some extent. Accordingly, alignment of the source layer SL1 with the source layer SL2 to join them together is easier than alignment between the pads to join them together.

The source layers SL1 and SL2 are bonded to each other and joined together, and thereby function as an integrated common source layer SL1 and SL2. With this configuration, the source layers SL1 and SL2 are electrically connected to each other.

Figure 9:
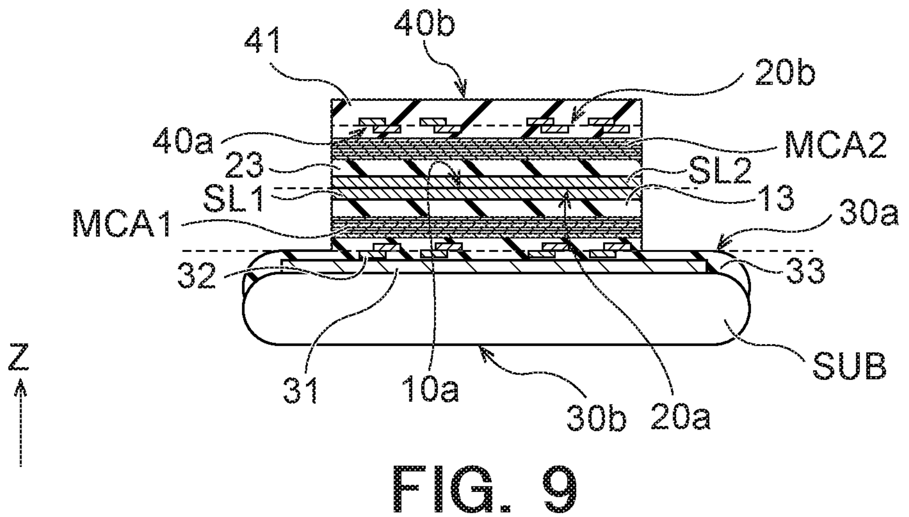
FIG. 9 is a cross-sectional view illustrating the manufacturing method of the semiconductor storage device, following FIG. 8.

Next, as illustrated in FIG. 9, the support substrate 400 is separated from the multilayered wire layer 40 or is polished to expose the multilayered wire layer 40.

Figure 10:
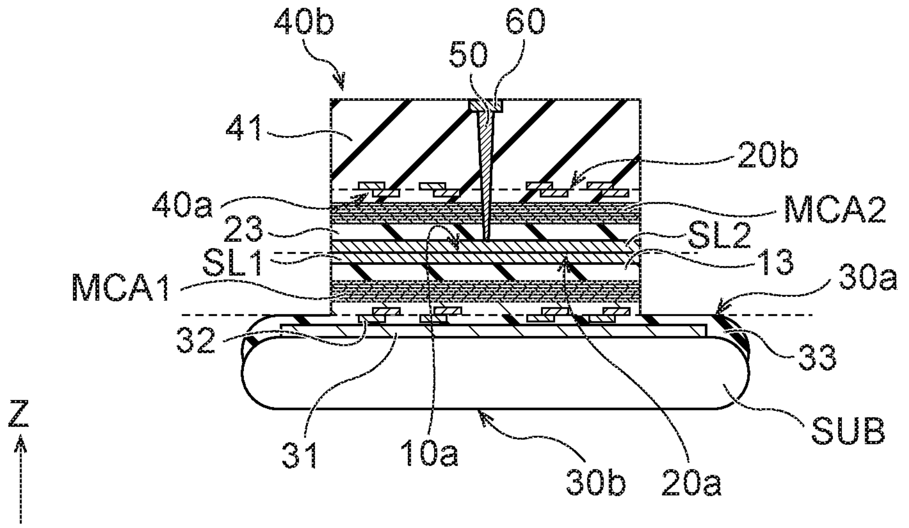
FIG. 10 is a cross-sectional view illustrating the manufacturing method of the semiconductor storage device, following FIG. 9.

Subsequently, as illustrated in FIG. 10, the interlayer dielectric film 41 is further deposited on the multilayered wire layer 40, and the contact plug 50 is formed through the interlayer dielectric film 41 so as to reach the source layer SL2. Further, the pad 60 is formed on the contact plug 50.

Thereafter, at the dicing step, the substrate SUB is cut and the semiconductor storage device 1 is diced into chips. Manufacturing of the semiconductor storage device 1 illustrated in FIG. 1 is thereby completed.

Second Embodiment

Figure 11:
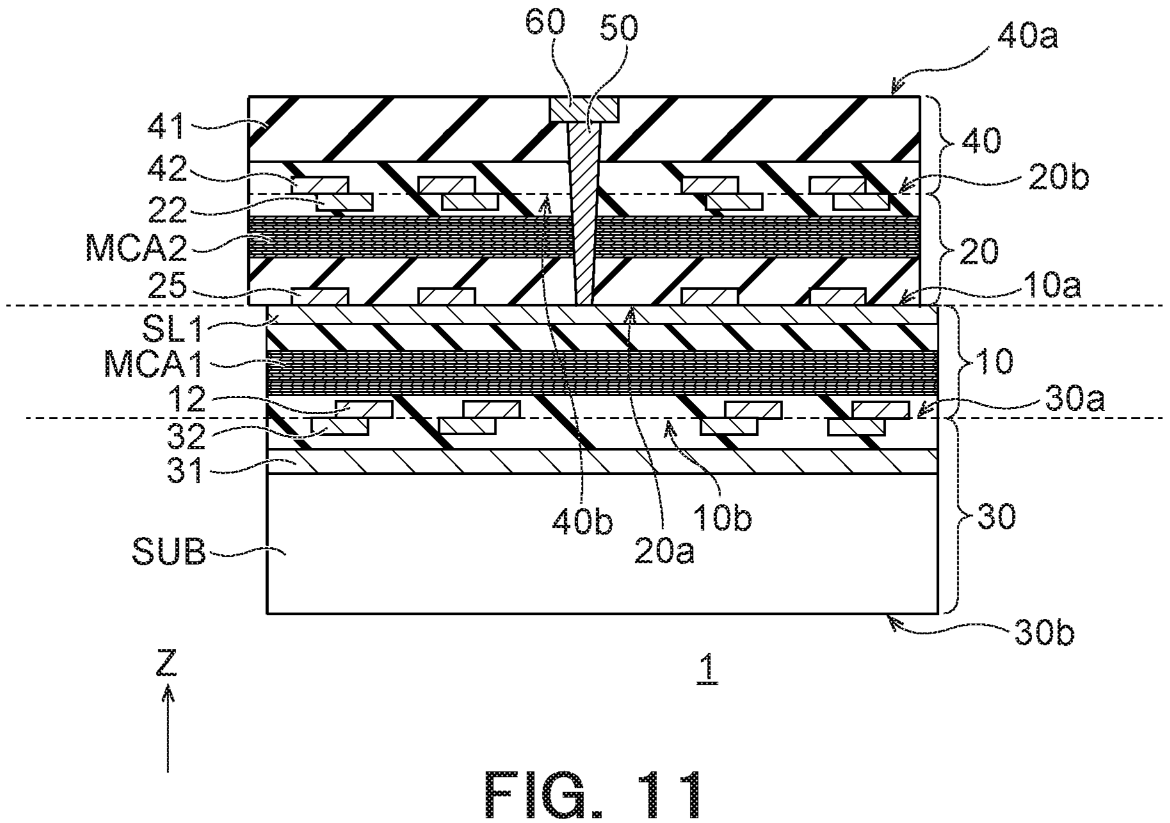
FIG. 11 is a cross-sectional view illustrating a configuration example of a semiconductor storage device according to a second embodiment.

FIG. 11 is a cross-sectional view illustrating a configuration example of the semiconductor storage device according to a second embodiment. The memory cell array layer 20 according to the second embodiment includes pads 25 instead of the source layer SL2. The pads 25 face the third surface 20*a* and are electrically connected to the memory cells in the memory cell array MCA2 through a multilayered wire layer (not illustrated).

The first surface 10*a* of the memory cell array layer 10 and the third surface 20*a* of the memory cell array layer 20 are bonded to each other, forming a bonding surface. The pads 25 in the memory cell array layer 20 are joined to the source layer SL1 of the memory cell array layer 10 on the bonding surface between the first surface 10*a* and the third surface 20*a*. With this configuration, the pads 25 are electrically connected to the source layer SL1 and transmit a source voltage to the source layer SL1.

Other configurations of the second embodiment may be substantially the same as corresponding configurations of the first embodiment. Therefore, the second embodiment can also obtain the effects of the first embodiment.

Figure 12:
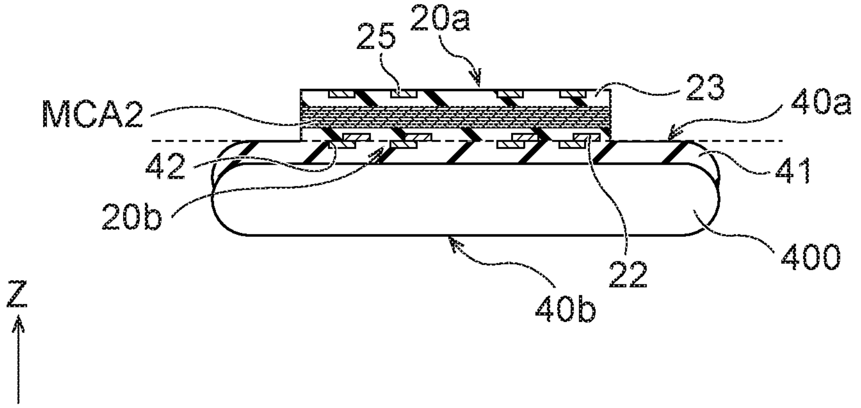
FIG. 12 is a cross-sectional view illustrating an example of a manufacturing method of the semiconductor storage device according to the second embodiment.

FIG. 12 is a cross-sectional view illustrating an example of the manufacturing method of the semiconductor storage device 1 according to the second embodiment. First, as described with reference to FIGS. 2A to 4, the support substrate 100 and the substrate SUB are bonded together, and the control circuit layer 30 and the memory cell array layer 10 are formed on the substrate SUB. Further, as described with reference to FIGS. 5A to 6, the support substrate 200 and the support substrate 400 are bonded together to obtain the structure illustrated in FIG. 6.

Next, after the support substrate 200 is removed, the pads 25 are formed above the memory cell array MCA2 as illustrated in FIG. 12. The pads 25 are formed on the surface of the multilayered wire layer 23 and are exposed from the interlayer dielectric film. A conductive material such as copper or tungsten is used for the pads 25. The pads 25 are electrically connected to the memory cell array MCA2 through the multilayered wire layer 23.

Next, as described with reference to FIGS. 8 to 10, the support substrate 400 is bonded to the substrate SUB, thereby to bond the pads 25 formed closer to the support substrate 400 to the source layer SL1 formed closer to the substrate SUB and join them together. With this configuration, the pads 25 are electrically connected to the source layer SL1. At this time, the source layer SL1 has an area substantially equal to or larger than that of the memory cell array MCA1, and accordingly an adequate electrical connection can still be ensured even when the positions of the pads 25 are misaligned to some extent. Therefore, alignment of the pads 25 with the source layer SL1 to join them together is easier than alignment between the pads to join them together.

Next, similarly to the first embodiment, the contact plug 50 is formed in the interlayer dielectric film used in the multilayered wire layer 40 so as to reach the source layer SL1, and the pad 60 is formed on the contact plug 50.

Thereafter, at the dicing step, the substrate SUB is cut and the semiconductor storage device 1 is diced into chips. Manufacturing of the semiconductor storage device 1 illustrated in FIG. 11 is thereby completed.

Substantially the same effects can also be obtained by maintaining the source layer SL2 formed closer to the support substrate 400, and using pads instead of the source layer SL1 formed closer to the substrate SUB.

Third Embodiment

Figure 13:
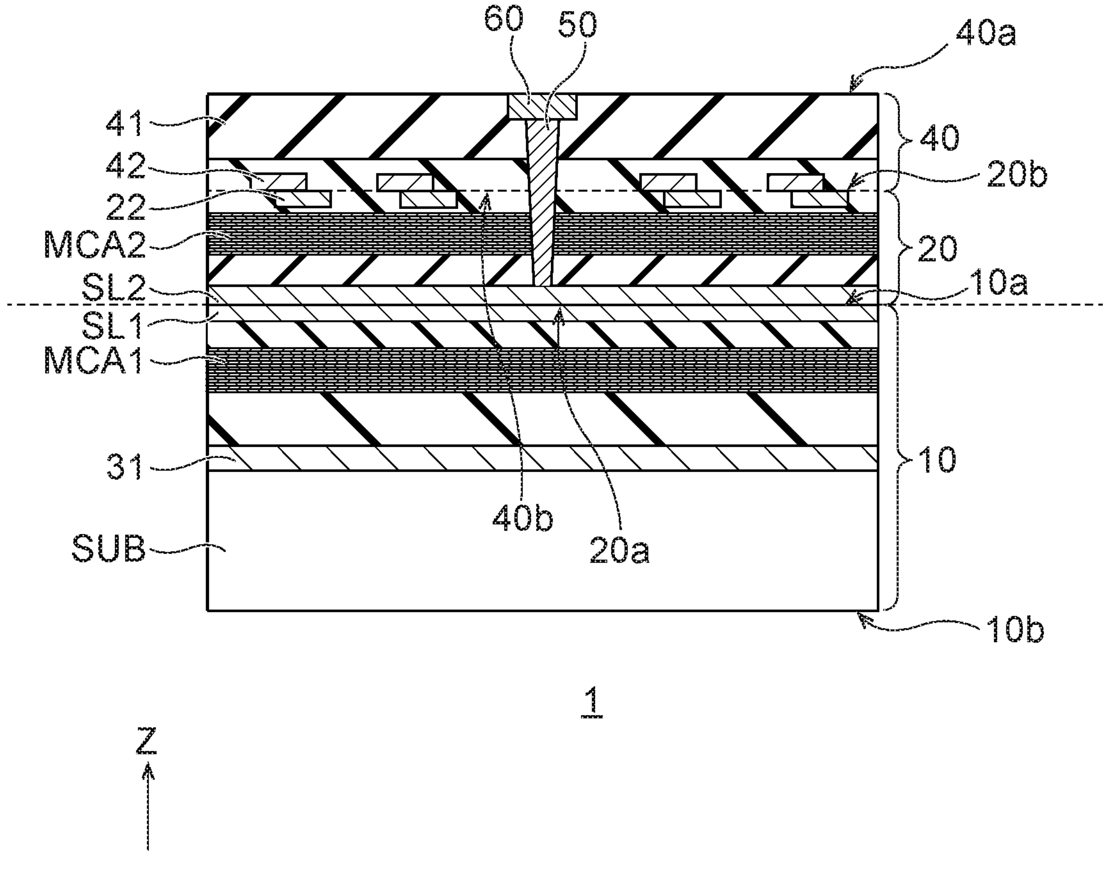
FIG. 13 is a cross-sectional view illustrating a configuration example of a semiconductor storage device according to a third embodiment.

FIG. 13 is a cross-sectional view illustrating a configuration example of a semiconductor storage device according to a third embodiment. According to the third embodiment, the control circuit layer 30 and the memory cell array layer 10 are integrated with each other, in which the CMOS circuit 31 and the memory cell array MCA1 are formed on the substrate SUB. The CMOS circuit is formed on the substrate SUB, and the memory cell array MCA1 is formed above the CMOS circuit. Therefore, the semiconductor storage device 1 according to the third embodiment is made up of the memory cell array layers 10 and 20 and the multilayered wire layer 40 that are bonded together (layered on top of one another). It is allowable that the CMOS circuit 31 is regarded as being included in the memory cell array layer 10. The CMOS circuit 31 is provided between the memory cell array MCA1 of the memory cell array layer 10 and the second surface 10*b* of the substrate SUB. The CMOS circuit 31 is electrically connected to the memory cell array MCA1 through a multilayered wire layer (not illustrated).

Other configurations of the third embodiment may be substantially the same as corresponding configurations of the first embodiment. Therefore, the third embodiment can obtain effects substantially the same as those of the first embodiment. The third embodiment can be combined with the second embodiment. Accordingly, the third embodiment can obtain effects substantially the same as those of the second embodiment.

In the memory cell array layer 10, it suffices that the CMOS circuit 31 is formed on the substrate SUB, and thereafter a multilayered wire layer is formed on the CMOS circuit 31, and then the memory cell array MCA1 is formed on the multilayered wire layer.

Figure 14:
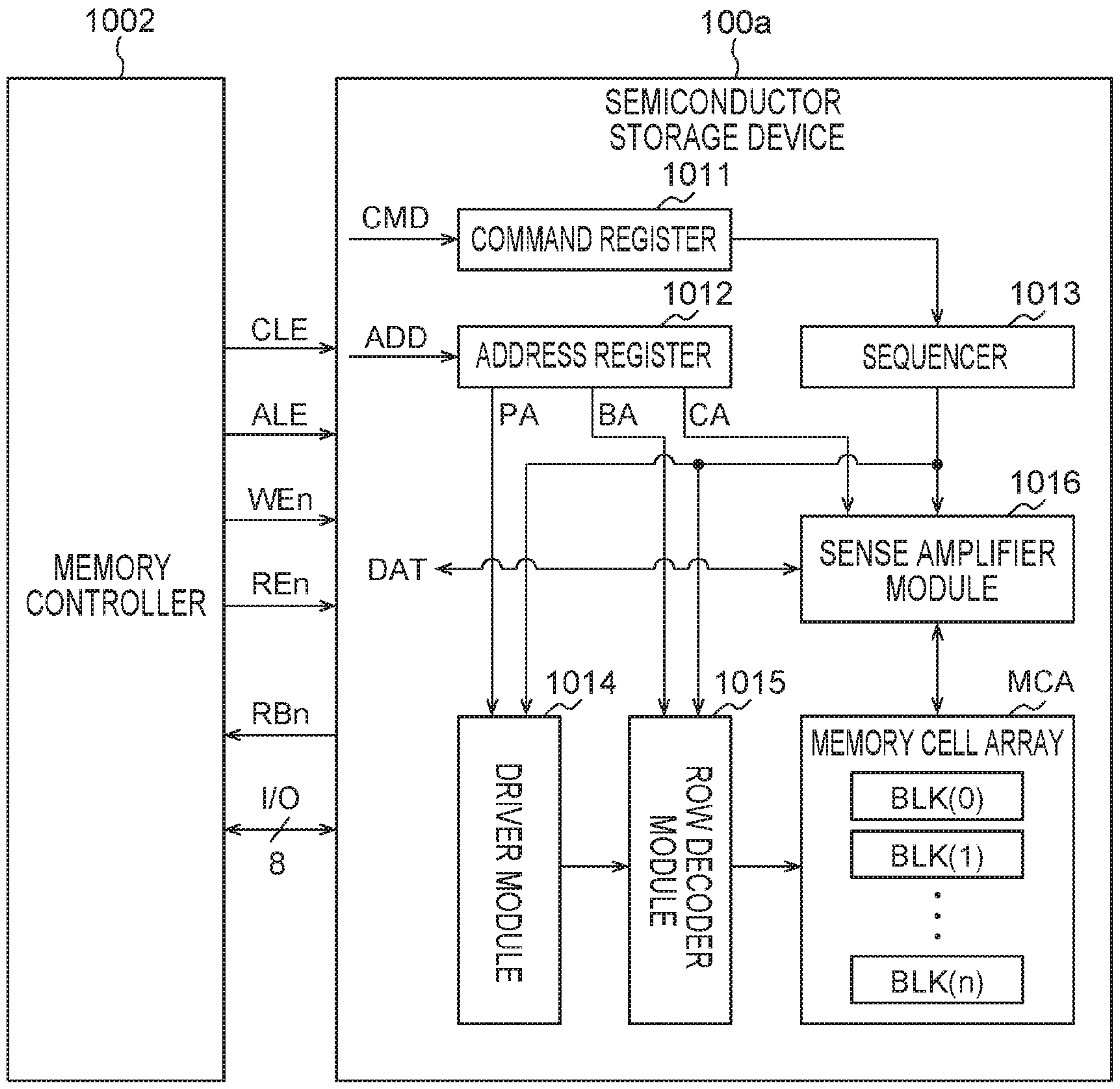
FIG. 14 is a block diagram illustrating a configuration example of a semiconductor storage device to which any of the above embodiments is applied.

FIG. 14 is a block diagram illustrating a configuration example of a semiconductor storage device to which any of the above embodiments is applied. The semiconductor storage device 1 is, for example, a NAND flash memory 100*a* (hereinafter, "memory 100*a*") capable of storing therein data in a nonvolatile manner. The semiconductor storage device 1 is controlled by an external memory controller 1002. For example, communication between the memory 100*a* and the memory controller 1002 supports the NAND interface standards.

As illustrated in FIG. 14, the memory 100*a* includes, for example, a memory cell array MCA, a command register 1011, an address register 1012, a sequencer 1013, a driver module 1014, a row decoder module 1015, and a sense amplifier module 1016.

The memory cell array MCA includes a plurality of blocks BLK(0) to BLK(n) (n is an integer equal to or larger than 1). The block BLK is a set of memory cells capable of storing data in a nonvolatile manner. For example, the block BLK is used as a unit of data erasure. The memory cell array MCA is provided with a plurality of bit lines and a plurality of word lines. For example, each memory cell is associated with a single bit line and a single word line. The memory cell array MCA includes memory cell arrays MCA1 and MCA2.

The command register 1011 holds a command CMD received by the memory 100*a* from the memory controller 1002. For example, the command CMD includes instructions to cause the sequencer 1013 to perform a read operation, a write operation, an erase operation, or other operations.

The address register 1012 holds address information ADD received by the memory 100*a* from the memory controller 1002. Examples of the address information ADD include a block address BA, a page address PA, and a column address CA. For example, the block address BA, the page address PA, and the column address CA are used respectively to select the block BLK, the word line, and the bit line.

The sequencer 1013 controls the entire operation of the memory 100*a*. For example, the sequencer 1013 controls the driver module 1014, the row decoder module 1015, the sense amplifier module 1016, and other modules based on the command CMD held in the command register 1011 to perform a read operation, a write operation, an erase operation, or other operations.

The driver module 1014 generates a voltage to be used in the read operation, the write operation, the erase operation, or other operations. The driver module 1014 then applies the generated voltage to a signal line corresponding to the selected word line, for example, based on the page address PA held in the address register 1012.

The row decoder module 1015 includes a plurality of row decoders. Each of the row decoders selects a single block BLK in the corresponding memory cell array MCA based on the block address BA held in the address register 1012. The row decoder then transfers, for example, the voltage applied to the signal line corresponding to the selected word line, to the selected word line in the selected block BLK.

In the write operation, the sense amplifier module 1016 applies a desired voltage to each bit line in response to write data DAT received from the memory controller 1002. In the read operation, the sense amplifier module 1016 determines the data stored in the memory cell based on the voltage of the bit line, and transfers the determination result to the memory controller 1002 as read data DAT.

The memory 100*a* and the memory controller 1002 described above may be combined with each other to configure one semiconductor storage device. As such a semiconductor storage device, a memory card such as an SDTM card, an SSD (solid state drive), and the like can be mentioned.

Figure 15:
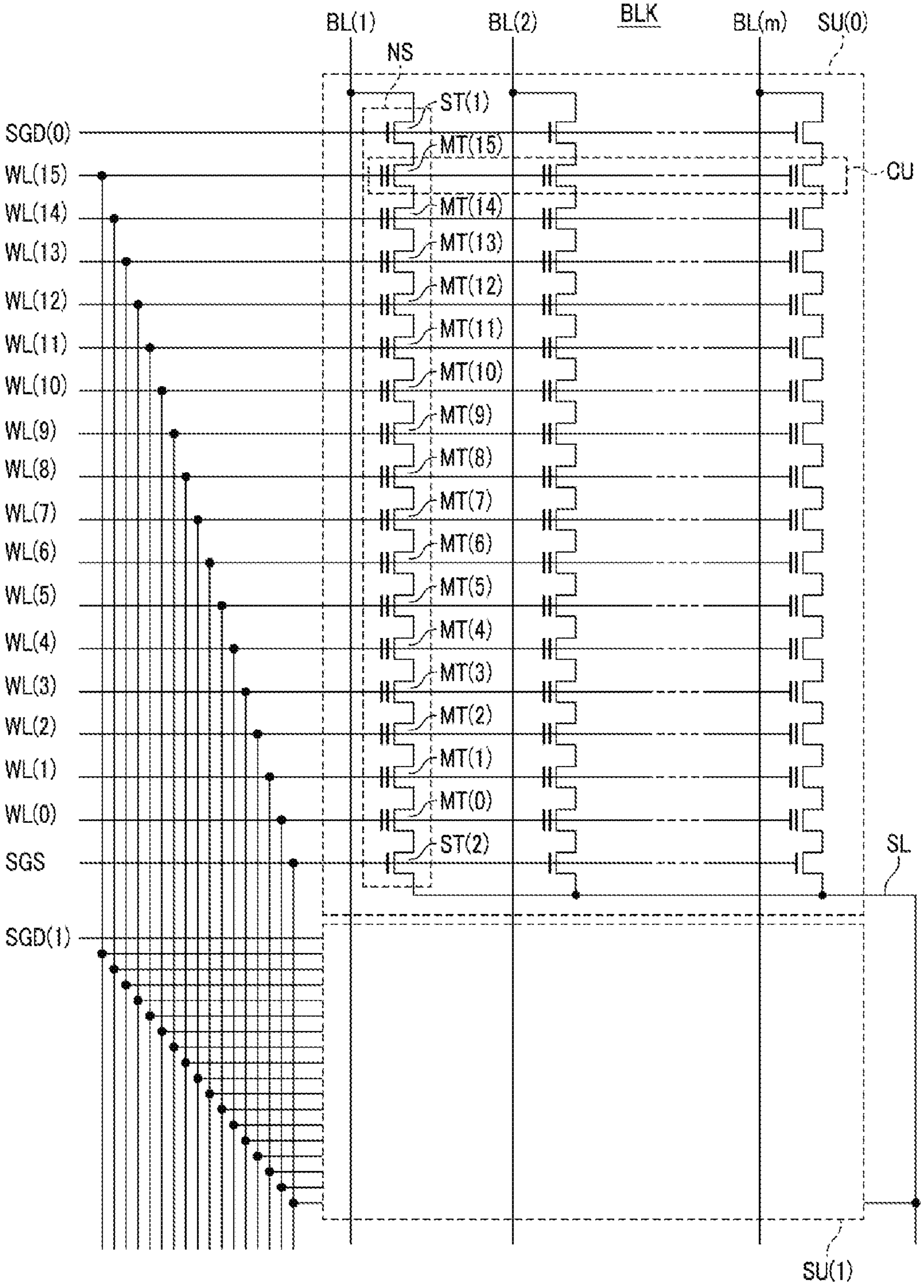
FIG. 15 is a circuit diagram illustrating an example of a circuit configuration of a memory cell array MCA.

FIG. 15 is a circuit diagram illustrating an example of a circuit configuration of the memory cell array MCA. One of the blocks BLK included in the memory cell array MCA is extracted. As illustrated in FIG. 15, the block BLK includes a plurality of string units SU(0) to SU(k) (k is an integer equal to or larger than 1).

Each string unit SU includes a plurality of NAND strings NS that are respectively associated with bit lines BL(0) to BL(m) (m is an integer equal to or larger than 1). Each of the NAND strings NS includes, for example, memory cell transistors MT(0) to MT(15) and selection transistors ST(1) and ST(2). The memory cell transistor MT includes a control gate and a charge storage layer, and holds data in a non-volatile manner. Each of the selection transistors ST(1) and ST(2) is used to select the string unit SU for each of the various operations.

In each of the NAND strings NS, the memory cell transistors MT(0) to MT(15) are connected in series. A drain of the selection transistor ST(1) is connected to the associated bit line BL. A source of the selection transistor ST(1) is connected to one end of the memory cell transistors MT(0) to MT(15) connected in series. A drain of the selection transistor ST(2) is connected to the other end of the memory cell transistors MT(0) to MT(15) connected in series. A source of the selection transistor ST(2) is connected to a source line SL.

Control gates of the memory cell transistors MT(0) to MT(15) in the same block BLK are connected in common to the word lines WL(0) to WL(15), respectively. In the string units SU(0) to SU(k), gates of the selection transistors ST(1) are connected in common to selection gate lines SGD(0) to SGD(k), respectively. Gates of the selection transistors ST(2) are connected in common to a selection gate line SGS.

In the circuit configuration of the memory cell array MCA described above, the bit line BL is shared by the NAND strings NS assigned with the same column address in the respective string units SU. The source line SL is shared between, for example, a plurality of blocks BLK.

A set of the memory cell transistors MT connected to the common word line WL in a single string unit SU is referred to as, for example, "cell unit CU". For example, the storage capacity of the cell unit CU including the memory cell transistors MT, each of which stores 1-bit data, is defined as "one page of data". The cell unit CU may have a storage capacity of two or more pages of data according to the number of data bits to be stored by the memory cell transistors MT.

The memory cell array MCA included in the memory 100*a* according to the present embodiment is not limited to the circuit configuration described above. For example, the memory cell array MCA may be designed in which each of the NAND strings NS can include any number of the memory cell transistors MT and any number of the selection transistors ST(1) and ST(2). The memory cell array MCA may also be designed in which each block BLK can include any number of the string units SU.

Figure 16:
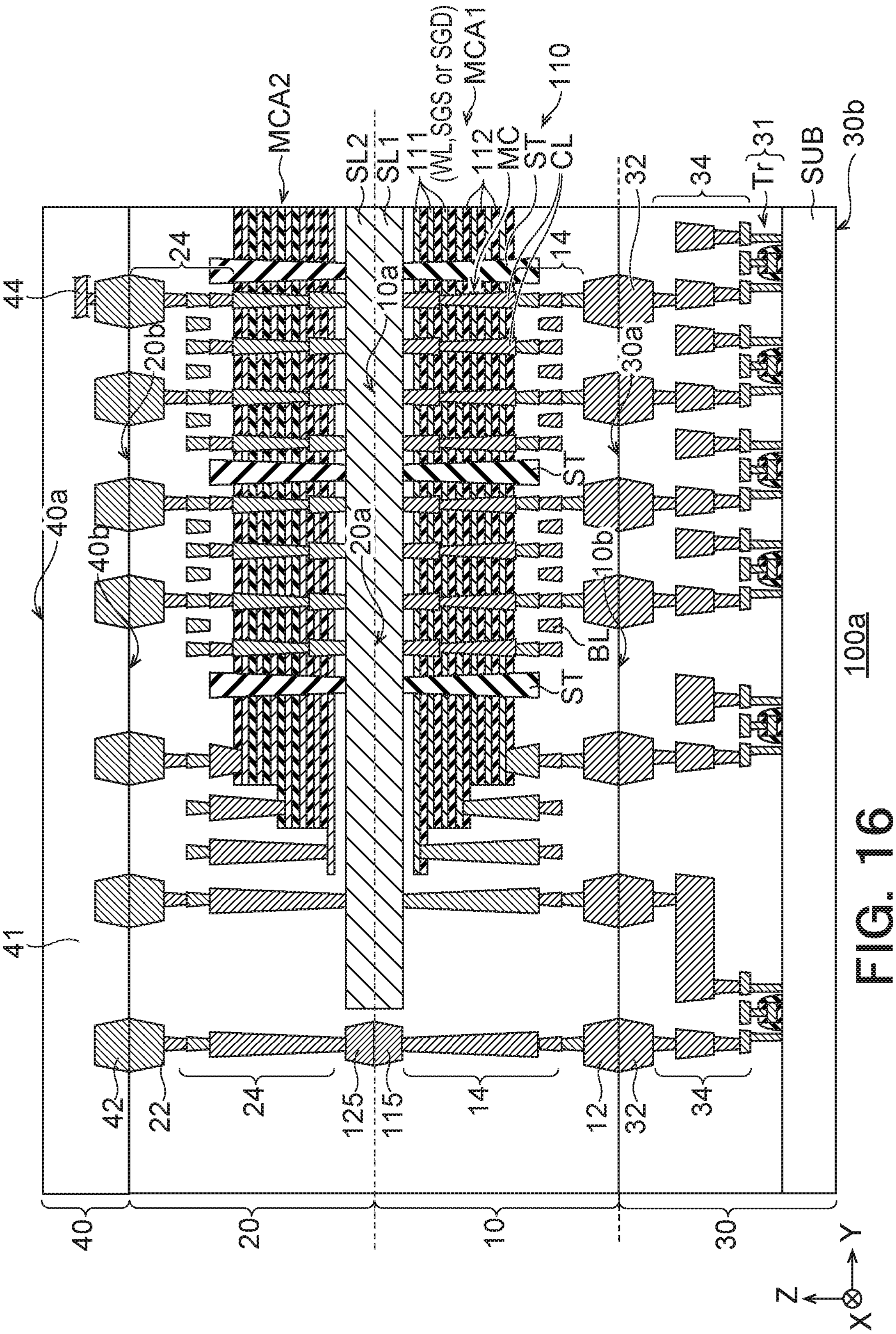
FIG. 16 is a cross-sectional view illustrating a configuration example of a memory.

FIG. 16 is a cross-sectional view illustrating a configuration example of the memory 100*a* in detail. The memory 100*a* includes the memory cell array layers 10 and 20 and the control circuit layer 30.

The memory cell array layer 10 and the memory cell array layer 20 are bonded together on the first surface 10*a* and the third surface 20*a*. The source layers SL1 and SL2 are joined to each other on the bonding surface between the memory cell array layer 10 and the memory cell array layer 20. With this configuration, the source layers SL1 and SL2 function as an integrated common source layer SL1 and SL2. The memory cell arrays MCA1 and MCA2 are electrically connected to the common source layer SL1 and SL2.

On the bonding surface between the memory cell array layer 10 and the memory cell array layer 20, a pad 115 in the memory cell array layer 10 is joined to a pad 125 in the memory cell array layer 20. The pad 115 is electrically connected to any of the semiconductor elements of the control circuit layer 30, such as a transistor Tr, through the multilayered wire layer 14, the pad 12, and other layers of the memory cell array layer 10.

The memory cell array layer 10 and the control circuit layer 30 are bonded on the second surface 10*b* and the fifth surface 30*a*. On the bonding surface between the memory cell array layer 10 and the control circuit layer 30, the pads 12 in the memory cell array layer 10 are joined to the pads 32 in the control circuit layer 30. The pads 32 are electrically connected to the semiconductor elements of the control circuit layer 30, such as the transistor Tr, through the multilayered wire layer 34.

The memory cell array layer 20 and the multilayered wire layer 40 are bonded together on the fourth surface 20*b* and the eighth surface 40*b*. On the bonding surface between the memory cell array layer 20 and the multilayered wire layer 40, the pads 22 in the memory cell array layer 20 are joined to the pads 42 in the multilayered wire layer 40. The pads 42 are electrically connected to each other optionally through the wire 44, while being electrically joined to the memory cell array MCA2 through the pads 22 and the multilayered wire layer 24 in the memory cell array layer 20.

In this manner, the memory cell array MCA1 of the memory cell array layer 10 is electrically connected to the CMOS circuit 31 of the control circuit layer 30 through the multilayered wire layers 14 and 34 and the pads 12 and 32. The memory cell array MCA2 of the memory cell array layer 20 is electrically connected to the CMOS circuit 31 of the control circuit layer 30 through the multilayered wire layers 40, 14, 24, and 34 and the pads 12, 22, 32, and 42.

With this configuration, the control circuit layer 30 is shared between the memory cell array layers 10 and 20, and thus can control both the memory cell arrays MCA1 and MCA2. The source layers SL1 and SL2 are also electrically connected to the CMOS circuit 31 through the multilayered wire layer 14 and other layers, and may further be connected to an external power supply (not illustrated) through the multilayered wire layers 14, 24, 34, and 40. Accordingly, the source voltage from the outside can be transmitted to the source layers SL1 and SL2.

Basically, the memory cell arrays MCA1 and MCA2 can have an identical configuration. Therefore, only the configuration of the memory cell array MCA1 is described below. The memory cell array MCA1 includes a layered member 110, columnar members CL, and slits ST.

The layered member 110 is made up of a plurality of electrode films 111 and a plurality of insulating films 112 that are alternately layered on top of one another along the Z direction. The layered member 110 forms the memory cell array. Conductive metal such as tungsten is used for the electrode films 111. As the insulating films 112, for example, silicon oxide films are used. The insulating films 112 insulate the electrode films 111 from each other. That is, the electrode films 111 are layered in a state of being insulated from each other. Any number of the electrode films 111 and the insulating films 112 can be layered. The insulating films 112 may be, for example, porous dielectric films or air gaps.

One or more of the electrode films 111 of the layered member 110, located at the upper end of the layered member 110 in its Z direction, function as a source-side selection gate SGS. One or more of the electrode films 111 of the layered member 110, located at the lower end thereof, function as a drain-side selection gate SGD. The electrode films 111 located between the source-side selection gate SGS and the drain-side selection gate SGD function as the word line WL. The word line WL is a gate electrode of the memory cell MC. The drain-side selection gate SGD is a gate electrode of the drain-side selection transistor. The source-side selection gate SGS is provided in the upper region of the layered member 110. The drain-side selection gate SGD is provided in the lower region of the layered member 110. The upper region refers to a region of the layered member 110 located closer to the control circuit layer 30. The lower region refers to a region of the layered member 110 located closer to the source layers SL1 and SL2.

The memory cell array MCA1 includes a plurality of memory cells MC connected in series between the source-side selection transistor and the drain-side selection transistor. A structure in which the source-side selection transistor, the memory cells MC, and the drain-side selection transistor are connected in series is called “memory string” or “NAND string”. For example, the memory string is connected to the bit line BL through the multilayered wire layer 14. The bit line BL is a wire provided below the layered member 110 and extending in the X direction (a direction perpendicular to the sheet plane in FIG. 1).

In the layered member 110, a plurality of columnar members CL are provided. Each of the columnar members CL extends in the layered member 110, penetrating the layered member 110 in its layer stacking direction (the Z direction), while being provided from the multilayered wire layer 14 connected to the bit line BL to the source layer SL1. The internal structure of the columnar member CL is described later. In the present embodiment, the columnar member CL is formed in two stages in the Z direction because of its high aspect ratio. However, it is allowable that the columnar member CL is formed in a single stage.

Further, in the layered member 110, a plurality of slits ST are provided. Each of the slits ST extends in the X direction and penetrates the layered member 110 in its layer stacking direction (the Z direction). The slit ST is filled with an insulating film such as a silicon oxide film. The insulating film is formed into a plate-like shape. The slits ST electrically separate the electrode films 111 of the layered member 110 from each other.

The source layers SL1 and SL2 are provided on the layered member 110. Low-resistance metal material such as doped polysilicon, copper, aluminum, or tungsten is used for the source layers SL1 and SL2.

Figure 17:
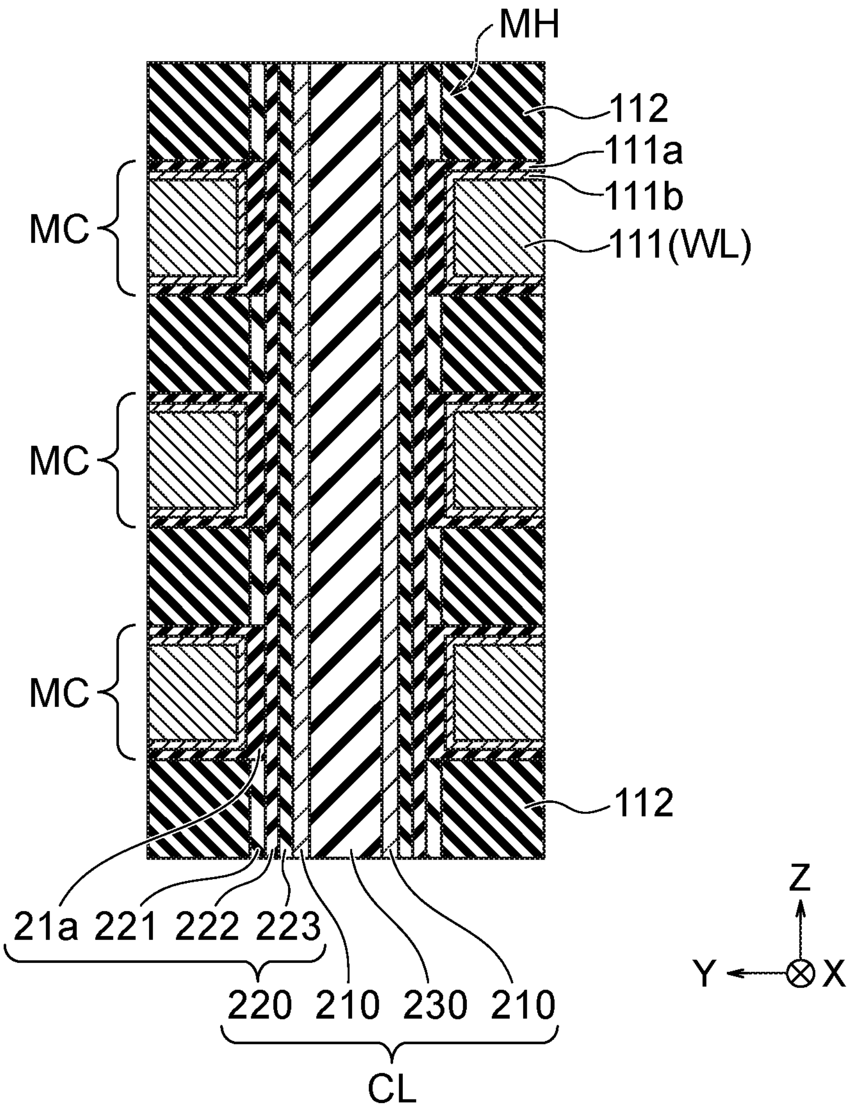
FIG. 17 is a cross-sectional view illustrating a configuration example of memory cells.
Figure 18:
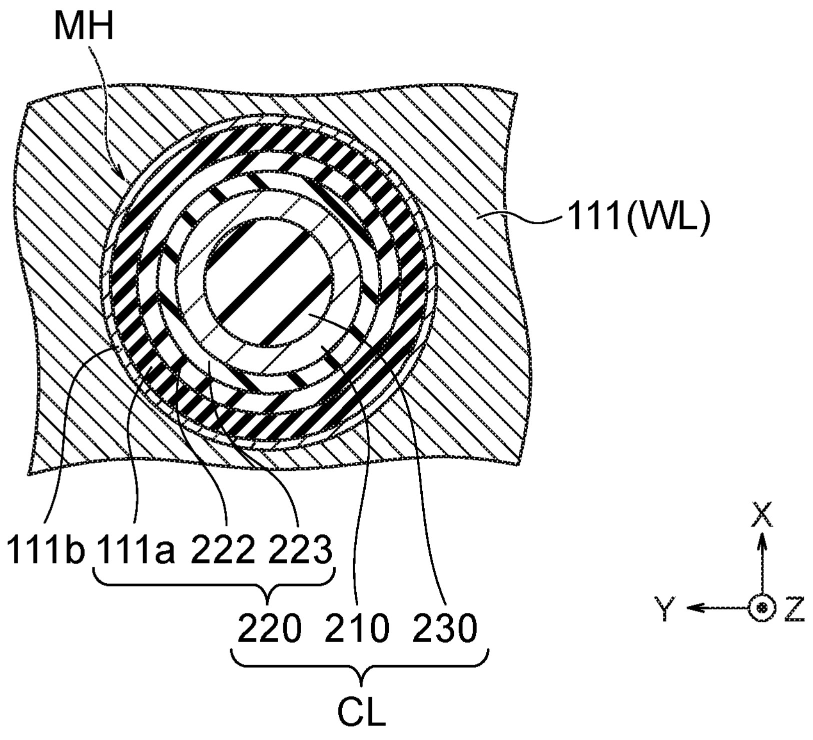
FIG. 18 is a cross-sectional view illustrating a configuration example of the memory cell.

FIGS. 17 and 18 are cross-sectional views illustrating a configuration example of the memory cell MC. Each of the columnar members CL is provided in a memory hole MH provided in the layered member 110. Each columnar member CL penetrates the layered member 110 from its upper end along the Z direction, and is provided in the layered member 110, extending to the source layer SL1. Each of the columnar members CL includes a semiconductor body 210, a memory film 220, and a core layer 230. The columnar member CL includes the core layer 230 provided in its central portion, the semiconductor body (semiconductor member) 210 provided around the core layer 230, and the memory film (charge storage member) 220 provided around the semiconductor body 210. The semiconductor body 210 extends in the layered member 110 in its layer stacking direction (the Z direction). The semiconductor body 210 is electrically connected to the source layer SL1. The memory film 220 is provided between the semiconductor body 210 and the electrode films 111, and includes a charge trap. The columnar members CL selected one by one from each finger are connected in common to a single bit line BL through the multilayered wire layer 14 in FIG. 16. The finger is a memory cell unit connected to a bit line BL during a read or a write operation.

As illustrated in FIG. 18, the memory hole MH has, for example, a circular shape or an elliptical shape in the X-Y plane. A block dielectric film 111*a* that forms a portion of the memory film 220 may be provided between the electrode film 111 and the insulating film 112. The block dielectric film 111*a* is, for example, a silicon oxide film or a metal oxide film. An example of the metal oxide is aluminum oxide. A barrier film 111*b* may be provided between the electrode film 111 and the insulating film 112, and between the electrode film 111 and the memory film 220. For example, when the electrode film 111 is made of tungsten, a layered-structure film of titanium nitride and titanium is selected as the barrier film 111*b*. The block dielectric film 111*a* prevents charge back tunneling from the electrode film 111 toward the memory film 220. The barrier film 111*b* improves the adhesion between the electrode film 111 and the block dielectric film 111*a*.

The semiconductor body 210 that is a semiconductor member has, for example, a bottomed cylindrical shape. For example, polysilicon is used for the semiconductor body 210. The semiconductor body 210 is made of, for example, undoped silicon. The semiconductor body 210 may also be made of p-type silicon. The semiconductor body 210 serves as a channel of a drain-side selection transistor STD, the memory cells MC, and a source-side selection transistor STS. A plurality of semiconductor bodies 210 in the same memory cell array MCA1 are electrically connected at their one end in common to the source layers SL1 and SL2. That is, the source layers SL1 and SL2 are connected in common to the semiconductor bodies 210 of the columnar members CL of the memory cell array MCA1. The memory cell array MCA2 also has substantially the same configuration as the memory cell array MCA1, in which the source layers SL1 and SL2 are also connected in common to the semiconductor bodies 210 of the columnar members CL of the memory cell array MCA2.

The memory film 220, excluding the block dielectric film 111*a*, is provided between the inner wall of the memory hole MH and the semiconductor body 210. The memory film 220 has, for example, a cylindrical shape. The memory cells MC have a storage area between the semiconductor body 210 and the electrode films 111 that serve as the word line WL, and are layered in the Z direction. The memory film 220 includes, for example, a cover dielectric film 221, a charge trap film 222, and a tunnel dielectric film 223. The semiconductor body 210, the charge trap film 222, and the tunnel dielectric film 223 extend in the Z direction.

The cover dielectric film 221 is provided between the insulating film 112 and the charge trap film 222. The cover dielectric film 221 contains, for example, silicon oxide. The cover dielectric film 221 protects the charge trap film 222 from being etched when a sacrificial film (not illustrated) is replaced with the electrode film 111 (a replacement step). The cover dielectric film 221 may be removed from between the electrode film 111 and the memory film 220 at the replacement step. In this case, as illustrated in FIGS. 17 and 18, for example, the block dielectric film 111*a* is not provided between the electrode film 111 and the charge trap film 222. When the replacement step is not employed in forming the electrode film 111, it is allowable that the cover dielectric film 221 is not provided.

The charge trap film 222 is provided between the block dielectric film 111*a* and the tunnel dielectric film 223, and between the cover dielectric film 221 and the tunnel dielectric film 223. The charge trap film 222 contains, for example, silicon nitride and has a trap site that traps charge in the film. A portion of the charge trap film 222, which is interposed between the semiconductor body 210 and the electrode film 111 that serves as the word line WL, forms the storage area of the memory cell MC to serve as a charge trap. The threshold voltage of the memory cell MC is varied depending on the presence or the absence of charge in the charge trap, or depending on the amount of charge trapped in the charge trap. With this threshold voltage, the memory cell MC holds information.

The tunnel dielectric film 223 is provided between the semiconductor body 210 and the charge trap film 222. For example, the tunnel dielectric film 223 contains silicon oxide, or contains silicon oxide and silicon nitride. The tunnel dielectric film 223 is a potential barrier between the semiconductor body 210 and the charge trap film 222. For example, when electrons are implanted from the semiconductor body 210 into the charge trap (the write operation), and when positive holes are implanted from the semiconductor body 210 into the charge trap (the erase operation), the electrons and the positive holes pass (tunnel) through the potential barrier of the tunnel dielectric film 223.

The core layer 230 fills the inner space of the cylindrical semiconductor body 210. The core layer 230 has, for example, a columnar shape. For example, the core layer 230 contains silicon oxide and has insulating properties.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:

a first layer including a first surface and a second surface located opposite to the first surface, the first layer including a first memory cell array and a first wire layer, the first memory cell array being provided between the first surface and the second surface and including a plurality of first memory cells, and the first wire layer facing the first surface and being electrically connected to the first memory cells;

a second layer including a third surface and a fourth surface located opposite to the third surface, the second layer including a second memory cell array provided between the third surface and the fourth surface to be electrically connected to the first wire layer and including a plurality of second memory cells, the second layer further including a first pad facing the third surface and electrically connected to the second memory cells;

a third layer including a fifth surface and a sixth surface located opposite to the fifth surface, the third layer including a CMOS circuit provided between the fifth surface and the sixth surface to be electrically connected to the first and second memory cells and the first wire layer;

a fourth layer including a seventh surface and an eighth surface located opposite to the seventh surface, the fourth layer including a third wire layer to be electrically connected to the first and second memory cells, the first wire layer and the CMOS circuit;

a contact plug penetrating the fourth layer and the second layer and electrically connected to the first wire layer; and a second pad electrically connected to the contact plug on the seventh surface, wherein the first layer and the second layer are joined together on the first surface and the third surface, the first layer and the third layer are joined together on the second surface and the fifth surface, the second layer and the fourth layer are joined together via the fourth surface and the eighth surface, the first wire layer and the first pad are directly joined together via the first surface and the third surface, and the first wire layer is set to a predetermined source voltage through the second pad and the contact plug.

2. The device of claim 1, wherein the first wire layer comprises a source layer.

3. The device of claim 1, wherein the first layer further includes a CMOS (Complementary Metal Oxide Semiconductor) circuit provided between the first memory cell array and the second surface, and the first memory cells and the second memory cells are electrically connected to the CMOS circuit.

4. The device of claim 1, wherein the first memory cell array includes a first layered member in which first insulating films and first conductive films are layered alternately in a first direction, and a plurality of first columnar members, each of which includes a first semiconductor portion and a charge trap film, the first semiconductor portion extending in the first layered member in the first direction and being electrically connected to the first wire layer, and the charge trap film being provided on an outer circumferential surface of the first semiconductor portion, and the second memory cell array includes a second layered member in which second insulating films and second conductive films are layered alternately in the first direction, and a plurality of second columnar members, each of which includes a second semiconductor portion and a charge trap film, the second semiconductor portion extending in the second layered member in the first direction and being electrically connected to the first wire layer, and the charge trap film being provided on an outer circumferential surface of the second semiconductor portion.

5. The device of claim 4, wherein the first wire layer is connected in common to the first semiconductor portions of the first columnar members, and is connected in common to the second semiconductor portions of the second columnar members.

* * * * *